(12) United States Patent
Kulkarni et al.

(10) Patent No.: US 9,689,924 B2
(45) Date of Patent: Jun. 27, 2017

(54) CIRCUIT FOR TESTING INTEGRATED CIRCUITS

(71) Applicant: STMICROELECTRONICS INTERNATIONAL N.V., Amsterdam (NL)

(72) Inventors: Anirudha Kulkarni, Greater Noida (IN); Jasvir Singh, Delhi (IN)

(73) Assignee: STMICROELECTRONICS INTERNATIONAL N.V. (NL)

( * ) Notice: Subject to any disclaimer, the term of this patent is extended or adjusted under 35 U.S.C. 154(b) by 0 days.

(21) Appl. No.: 14/980,994

(22) Filed: Dec. 28, 2015

(65) Prior Publication Data

US 2016/0131705 A1    May 12, 2016

Related U.S. Application Data

(62) Division of application No. 14/575,207, filed on Dec. 18, 2014, which is a division of application No. 12/871,045, filed on Aug. 30, 2010, now Pat. No. 8,918,689.

(30) Foreign Application Priority Data

Jul. 19, 2010    (IN) .......................... 1682/DEL/2010

(51) Int. Cl.
| | | |
|---|---|---|
| G01R 31/3185 | (2006.01) | |
| G01R 31/3187 | (2006.01) | |
| G11C 29/26 | (2006.01) | |
| G01R 31/319 | (2006.01) | |
| G11C 29/12 | (2006.01) | |
| G11C 29/32 | (2006.01) | |
| G01R 31/3177 | (2006.01) | |
| G01R 31/317 | (2006.01) | |

(52) U.S. Cl.
CPC . *G01R 31/318563* (2013.01); *G01R 31/3177* (2013.01); *G01R 31/3187* (2013.01); *G01R 31/31724* (2013.01); *G01R 31/31727* (2013.01); *G01R 31/31922* (2013.01); *G01R 31/318533* (2013.01); *G01R 31/318536* (2013.01); *G01R 31/318538* (2013.01); *G01R 31/318552* (2013.01); *G01R 31/318558* (2013.01); *G01R 31/318572* (2013.01); *G01R 31/318594* (2013.01); *G01R 31/318597* (2013.01); *G11C 29/12* (2013.01); *G11C 29/12015* (2013.01); *G11C 29/26* (2013.01); *G11C 29/32* (2013.01); *G11C 2029/3202* (2013.01)

(58) Field of Classification Search
CPC ........ G01R 31/318563; G01R 31/3187; G01R 31/318572; G01R 31/318536; G11C 29/26

See application file for complete search history.

(56) References Cited

U.S. PATENT DOCUMENTS

| | | | | |
|---|---|---|---|---|
| 5,285,453 A | * | 2/1994 | Gruodis ........... | G01R 31/31813 714/726 |
| 5,349,587 A | * | 9/1994 | Nadeau-Dostie | G01R 31/318552 714/729 |

(Continued)

*Primary Examiner* — Joseph D Torres
(74) *Attorney, Agent, or Firm* — Slater Matsil LLP

(57) ABSTRACT

An integrated circuit is configured to receive a test clock input and includes circuitry configured to generate test clocks from the test clock input, and test circuitry configured to use the test clocks in a test mode.

14 Claims, 11 Drawing Sheets

(56) References Cited

U.S. PATENT DOCUMENTS

| | | | |
|---|---|---|---|
| 5,428,622 A * | 6/1995 | Kuban | G01R 31/318536 324/73.1 |
| 5,636,227 A * | 6/1997 | Segars | G01R 31/318561 714/729 |
| 5,642,363 A * | 6/1997 | Smith | G01R 31/318536 714/729 |
| 5,680,543 A | 10/1997 | Bhawmik | |
| 5,805,608 A | 9/1998 | Baeg et al. | |
| 5,870,591 A | 2/1999 | Sawada | |
| 6,175,603 B1 | 1/2001 | Chapman et al. | |
| 6,343,365 B1 * | 1/2002 | Matsuzawa | G01R 31/318586 365/201 |
| 6,405,335 B1 * | 6/2002 | Whetsel | G01R 31/318536 714/726 |
| 6,532,560 B1 | 3/2003 | Miyake | |
| 6,587,981 B1 * | 7/2003 | Muradali | G01R 31/318555 714/726 |
| 6,658,611 B1 * | 12/2003 | Jun | G11C 29/50012 365/201 |
| 6,686,759 B1 | 2/2004 | Swamy | |
| 6,690,219 B2 | 2/2004 | Chuang | |
| 6,823,029 B1 | 11/2004 | Chapman et al. | |
| 6,847,241 B1 | 1/2005 | Nguyen et al. | |
| 6,990,619 B1 * | 1/2006 | Kapur | G01R 31/318547 714/729 |
| 7,107,477 B1 | 9/2006 | Singh et al. | |
| 7,188,326 B2 | 3/2007 | Yoshida | |
| 7,299,391 B2 * | 11/2007 | Tseng | G01R 31/318569 714/727 |
| 7,464,286 B1 | 12/2008 | Singh et al. | |
| 7,536,617 B2 | 5/2009 | Jun et al. | |
| 7,624,322 B2 | 11/2009 | Duggal et al. | |
| 7,657,854 B2 * | 2/2010 | Goel | G01B 31/318536 714/726 |
| 7,659,741 B2 * | 2/2010 | Whetsel | G01R 31/31715 324/750.3 |
| 7,793,179 B2 | 9/2010 | Sul | |
| 7,844,875 B2 | 11/2010 | Jun et al. | |
| 8,086,889 B2 | 12/2011 | Ito et al. | |
| 2004/0268181 A1 | 12/2004 | Wang et al. | |
| 2005/0283690 A1 * | 12/2005 | McLaurin | G01R 31/318572 714/726 |
| 2006/0031807 A1 * | 2/2006 | Abramovici | G01R 31/318533 716/106 |
| 2007/0208970 A1 * | 9/2007 | Marinissen | G01R 31/31701 714/724 |
| 2008/0010573 A1 | 1/2008 | Sul | |
| 2008/0222471 A1 | 9/2008 | Sul et al. | |
| 2008/0282110 A1 | 11/2008 | Guettaf | |
| 2009/0113230 A1 | 4/2009 | Ito et al. | |

* cited by examiner

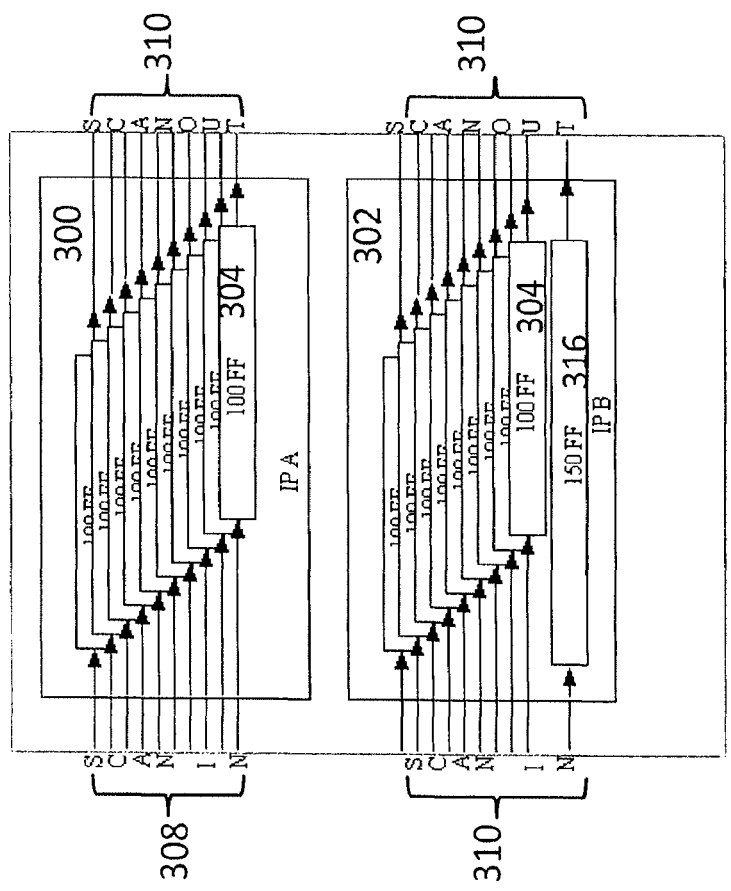

US 9,689,924 B2

CIRCUIT FOR TESTING INTEGRATED CIRCUITS

FIELD OF THE INVENTION

The present invention relates to testing, for example but not exclusively to testing an integrated circuit.

BACKGROUND

Integrated circuits often are provided with BIST (built-in self-test) circuitry. The BIST circuitry may be used to test parts of a circuit during the design of a circuit. For example an integrated circuit which has BIST circuitry can be tested by automated test equipment (ATE). The BIST circuitry may comprise one or more scan chains. The ATE may be arranged to scan in a plurality of scan values and to receive a plurality of output scan values. These output scan values can be analysed to determine if the part of the circuit under test is performing correctly.

SUMMARY

According to a first aspect, there is provided an integrated circuit which includes an input node configured to receive a test clock input signal, circuitry configured to generate from said test clock input signal a plurality of test clock signals, and test circuitry configured to use said test clock signals in a test mode.

According to a second aspect, there is provided a test arrangement which includes a first test scan chain; a second test scan chain, a scan data input node coupled to said first scan chain and to said second scan chain, and a scan data output node configured to provide a scan data output signal from one of the first and second test scan chains.

According to a third aspect there is provided an integrated circuit comprising at least one first group comprising a plurality of portions to be tested, each of said plurality of said portions having respective test circuitry; and at least one second group comprising at least one portion to be tested, the at least one portion to be tested having respective test circuitry, wherein said first and second groups are configured so that in use said test circuitry in the at least one first group is configured to run in parallel with test circuitry in said at least one second group and said respective test circuitry associated with said plurality of portions to be tested in said at least one first group is configured to be run serially.

BRIEF DESCRIPTION OF THE DRAWINGS

Reference will be made by way of example only to the accompanying drawings in which:

FIG. 8*c* schematically shows an arrangement similar to FIG. 8*a* but where one of the scan chains is longer than the other scan chains.

DETAILED DESCRIPTION OF PREFERRED EMBODIMENTS

Figure 1:
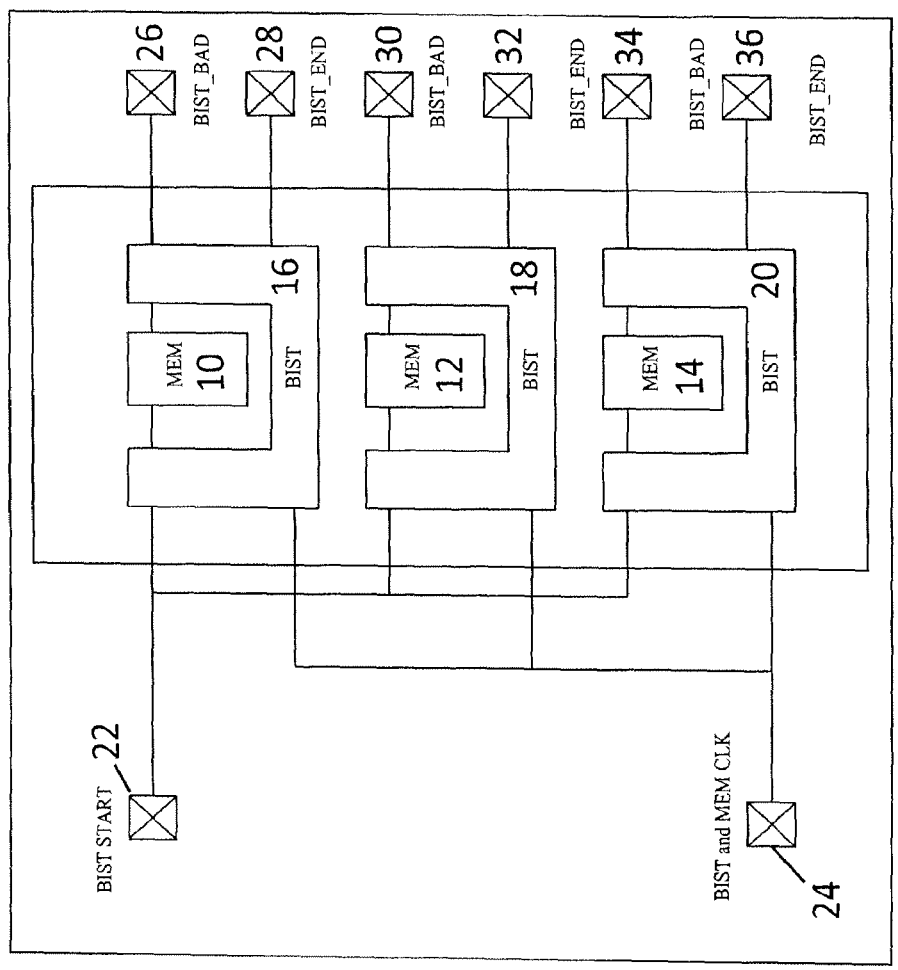
FIG. 1 shows a typical memory BIST arrangement.

Reference is first made to FIGS. 1 to 4. FIG. 1 which shows a schematic view of a typical memory BIST connection. In the arrangement shown in FIG. 1, a first memory 10, a second memory 12 and a third memory 14 are shown. Each of those memories 10 to 14 has a respective BIST circuit 16, 18 and 20 respectively. The memories may be in different blocks and/or in the same block of the system on chip SoC.

Each of the BIST circuitry 16 to 20 is arranged to receive the same BIST START signal 22 which is input via an input pad. Additionally, each BIST circuit 16, 18 and 20 is arranged to receive the same BIST and MEM (memory) clock signal 24, again via an input pad. It should be appreciated that in the arrangement shown in FIG. 1, the same BIST START signal is input to each of the BIST circuitry 16 to 18. Likewise, the same BIST and memory clock signal is input to each of the BIST circuitry 16 to 20. However, in some arrangements different BIST START and/or clock signals may be provided to the respective BIST circuitry.

Each BIST circuitry 16 to 20 provides a BIST_BAD signal and a BIST_END signal. These two signals may be regarded as status flags. The BIST_END has a status which when asserted indicates that the BIST run has been completed. When the BIST_END signal goes high indicating that the BIST run has finished, the BIST_BAD signal shows that whether the memory, on which the BIST is run, is for example free or not of physical defects.

One or both of the BIST_BAD and BIST END signals are asserted when the signal goes high. However, one or both of the BIST_BAD and BIST END signals may be asserted when the signal goes low in other embodiments. In the example described now, both of the BIST_BAD and BIST END signals are asserted when the signal goes high.

Outputs 26, 30 and 34 are respectively the BIST_BAD signals for the respective BIST circuits 16 to 20. Outputs 28, 32 and 36 are respectively the BIST_END outputs for BIST circuitry 16 to 20.

Figure 2:
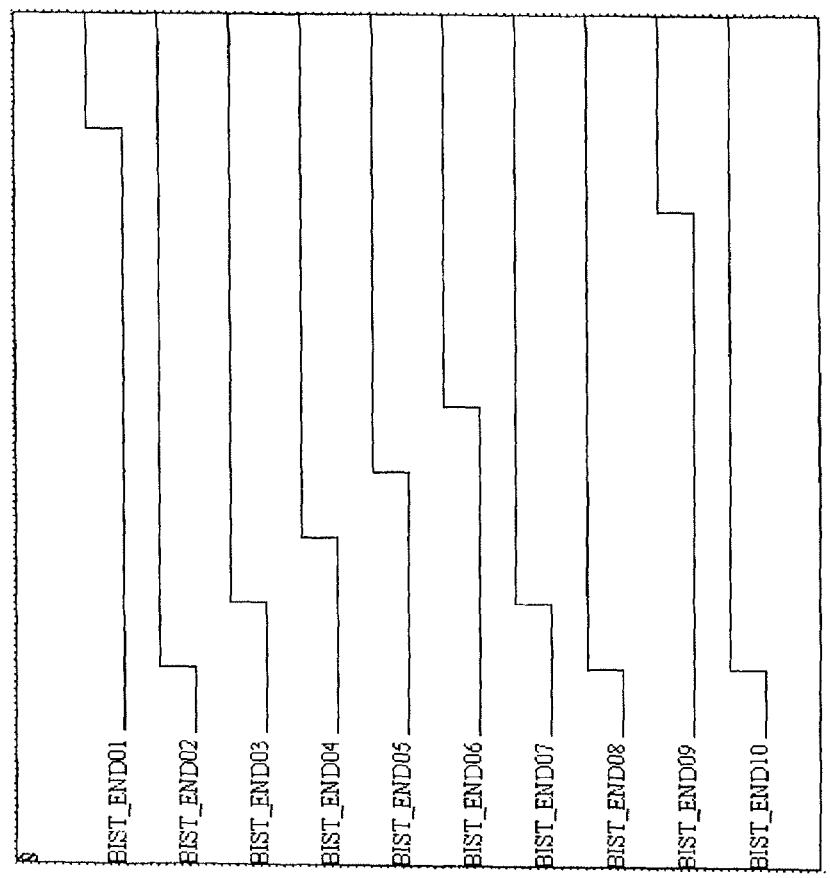
FIG. 2 shows BIST_END signals for an example with ten memories.

Reference is made to FIG. 2 which shows ten BIST_END signals. The arrangement shown in FIG. 1 shows three memory BIST arrangements. In practice, a circuit may have many more than three memories and/or different parts of memory under test. Each of the BIST_END signals has a first low state whilst the test is taking place and then changes to a high state when the test has been completed. As can be seen from FIG. 2, the BIST run time (that is the time up until the BIST_END signal is asserted) differs from memory to memory. The BIST run time for each memory may for example depend on the size of the memory and/or complexity of a test associated with a particular memory. Accordingly, the BIST test for each memory may finish at different points in time.

When all the BIST circuitry is running, a relatively large peak power may be consumed. This is potentially damaging to a system on chip, even one without any faults. It has been proposed to deal with the peak power consumption by running the BIST circuitry in series. However, in some embodiments, this may be disadvantageous in that this increases the time taken to test a system on chip.

Figure 3:
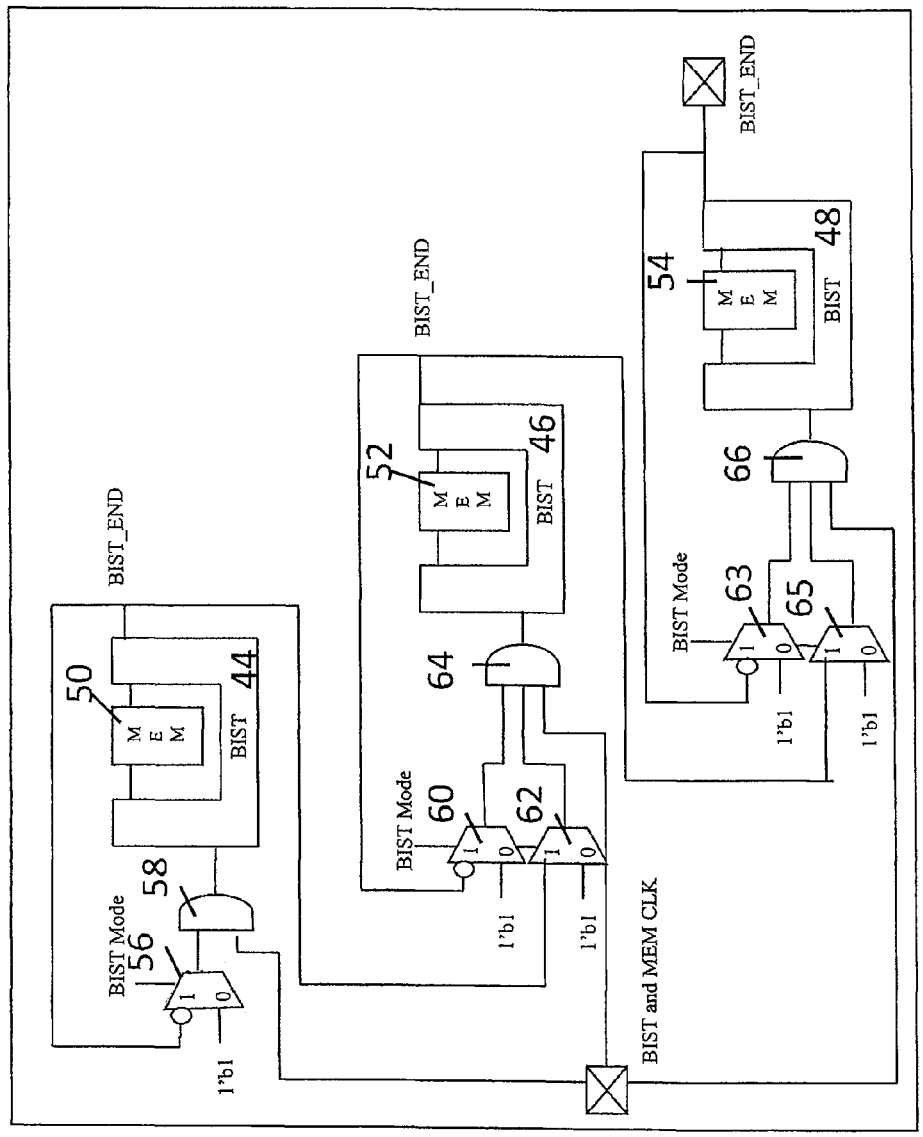
FIG. 3 shows an embodiment showing a group of memories with BIST circuitry.
Figure 4:
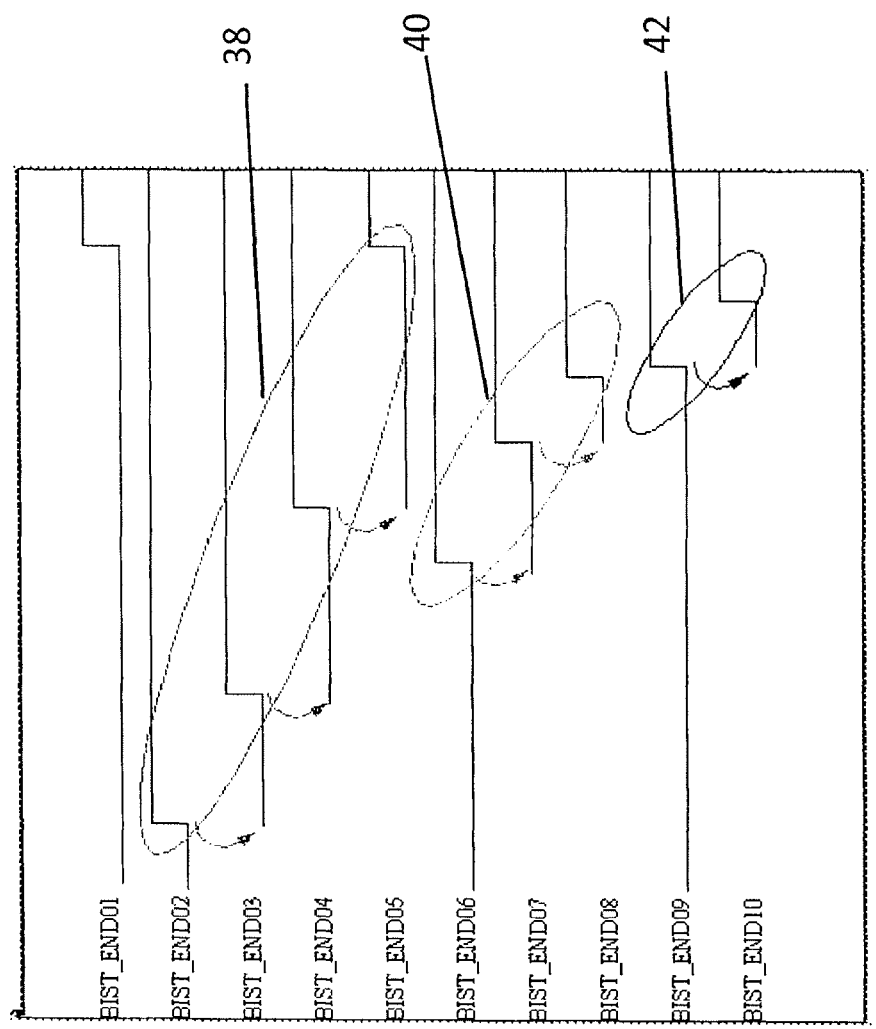
FIG. 4 shows BIST_END signals for an example where some memories are grouped together.

Reference is made to FIG. 3 which shows an embodiment in which the BIST circuitry is run in serial as well as in parallel. Before describing FIG. 3 in detail, reference will now be made to FIG. 4 which shows the BIST_END signals in an embodiment of the invention. In one arrangement, the memories are arranged in groups. In the arrangement shown in FIG. 4, the second, third and fourth BIST circuitry forms one group 38, the sixth, seventh and eighth BIST circuitry forms a second group whilst the ninth and tenth circuitry forms a third group 42. The first BIST circuitry is not grouped with any other BIST circuitry. Each of the groups along with the first BIST circuitry is arranged to work in parallel. Within a group only one BIST circuitry is in operation. When the test on one BIST circuitry in a group has been completed, the next BIST circuitry in the group is run and so on. For example, in the first group 38, the second BIST circuitry runs its test and once that has been completed, the third BIST circuitry is run and once that test has been completed then fourth BIST circuitry is run. Finally, once the fourth BIST circuitry has completed its test, then the fifth BIST circuitry is run. The transition of the BIST_END signal of one BIST circuitry to the end condition, i.e. the high value in the example shown in FIG. 4 is used to cause the next BIST circuitry to start running.

To summarise, at least two groups are provided which are arranged to run their tests in parallel. At least one of the groups running in parallel will have two or more BIST circuits which run serially. A group may comprise one BIST circuit only.

Reference is made to FIG. 3 which shows a group where there are three BIST circuits 44, 46 and 48. This could for example correspond to the sixth, seventh and eighth BIST circuitry of FIG. 4. Each of the BIST circuitry 44, 46 and 48 is associated with a respective memory 50, 52 and 54.

A first multiplexor 56 is provided. The first multiplexor 56 has a first input which is the inverted BIST_END signal of the first BIST circuitry 54. The multiplexor has a second input which comprises the data for use in a non test mode. The first multiplexor has a BIST mode control signal which controls the first multiplexor. The output of the first multiplexor 56 is connected to the input of a first AND gate 58 which also receives BIST and memory clock signal. The BIST mode signal is '1' during the BIST run and thus selects the inverted BIST_END signal as the output of the first multiplexor 56. When the BIST run starts, all BIST_END signals are '0'. When first BIST circuitry 50 completes its run, the BIST_END signal for the first BIST circuitry goes high. This BIST_END signal is fed back, in an inverted form, through the first multiplexor 56 to the first AND gate 58 which controls the clock input. When the BIST_END signal is high, the clock to that first BIST circuitry is stopped. This stops the first BIST circuitry. At the same time, the clock to the next BIST circuitry is enabled.

Associated with the second BIST circuitry 46 is a second multiplexor 60 and a third multiplexor 62. The second multiplexor 60 is arranged to receive the inverted BIST_END signal associated with the second BIST circuitry 46 as a first input. A second input is provided to receive the data for used in a non test mode. The third multiplexor 62 is arranged to receive the BIST_END signal output from the first BIST circuitry as a first input and the data for use in a non test mode as a second input. Both of the multiplexors are also arranged to receive the BIST mode signal. A second AND gate 64 is provided which receives an input from each of the multiplexors 60 and 62 as well as the BIST and memory clock signal.

The second BIST circuitry 64 will run when the BIST mode is selected, the BIST test has been completed for the first BIST circuitry 44 such that the BIST_END signal of the first BIST circuitry 44 is high and the BIST_END signal of the second BIST circuitry 46 is low. When the BIST_END signal of the second BIST circuitry is asserted, that is goes high, this stops the second BIST circuitry 46. It should be appreciated that the second multiplexer 60 operates in the same way as the first multiplexer 56. It should be appreciated that whilst the first BIST circuitry 44 is running and hence the BIST_END signal associated with a first circuitry is low, then this means the third multiplexer presents a low signal to the second AND gate such that the clock to the second BIST circuitry 46 is stopped.

Fourth and fifth multiplexors 63 and 65 are provided, which are similar to the second and third multiplexors. However, the fourth multiplexor 63 receives the inverted output of the BIST_END signal of the third BIST circuitry 48 at one input and non test data at a second input. The fifth BIST multiplexor 64 receives the BIST_END signal output by the second BIST circuitry 46 at one input and non test data at a second input. Additionally, each of the multiplexors receives the BIST mode signal. The output of the fourth and the fifth multiplexors are connected to respective inputs of a third AND gate 66 as is the BIST and memory clock. This third AND gate operates in a similar manner to the second AND gate, the output of that AND gate being connected to the third BIST circuitry 48. When the BIST END signal of the second BIST circuitry is low, which occurs when the first or second BIST circuitry is being run, then the third BIST circuitry 48 does not run. Only when the BIST_END signal from the second BIST circuitry 46 is asserted high and the BIST_END signal of the third BIST circuitry 48 is low will the third BIST circuitry 48 run. The third BIST circuitry 48 will run until the BIST_END signal associated with the third BIST circuitry 48 is asserted high.

Thus, in the arrangement of FIG. 3, the first BIST circuitry is run and once that test has been completed, the second BIST circuitry is run and again when that second test is completed, then the third test circuitry is run. In other words, the first to third BIST circuitry of FIG. 3 are run serially. Whilst this group of BIST circuitry is being run, in parallel one or more other groups or single BIST circuitry will be run.

This mechanism thus may allow effective testing of different sizes of memory. By dividing the memories into groups and running only one memory per group at a time, the peak power may be reduced.

It should be appreciated that the number of memories in a group may be any suitable number other than those described by way of example previously.

Figure 5:
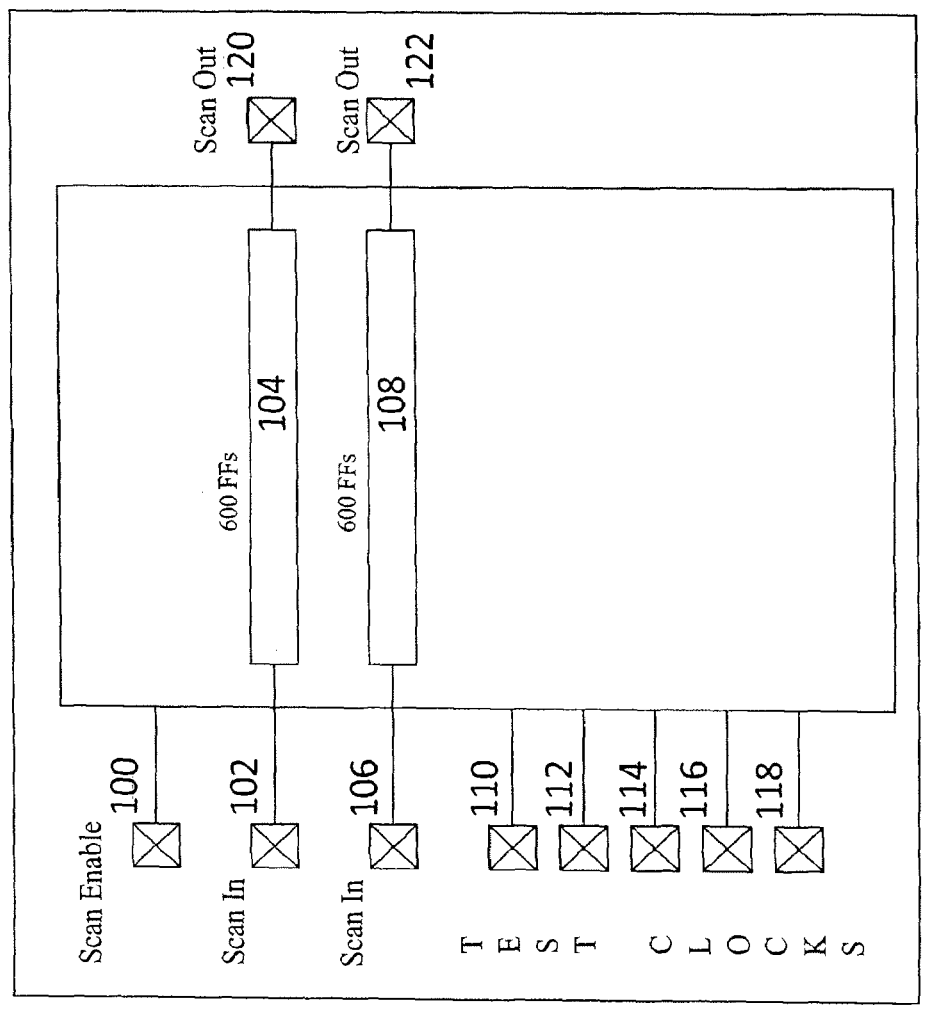
FIG. 5 shows schematically a relationship between scan chains and number of clocks.
Figure 6:
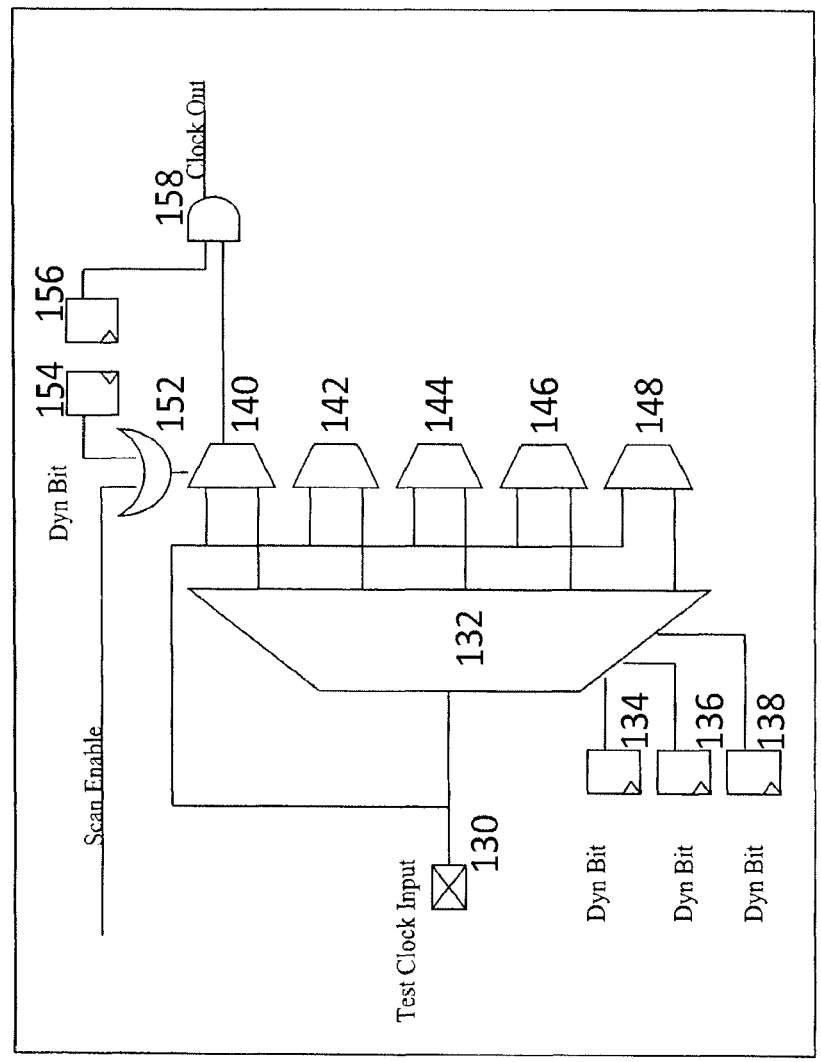
FIG. 6 shows an embodiment for reducing the number of pads for clock signals.
Figure 7:
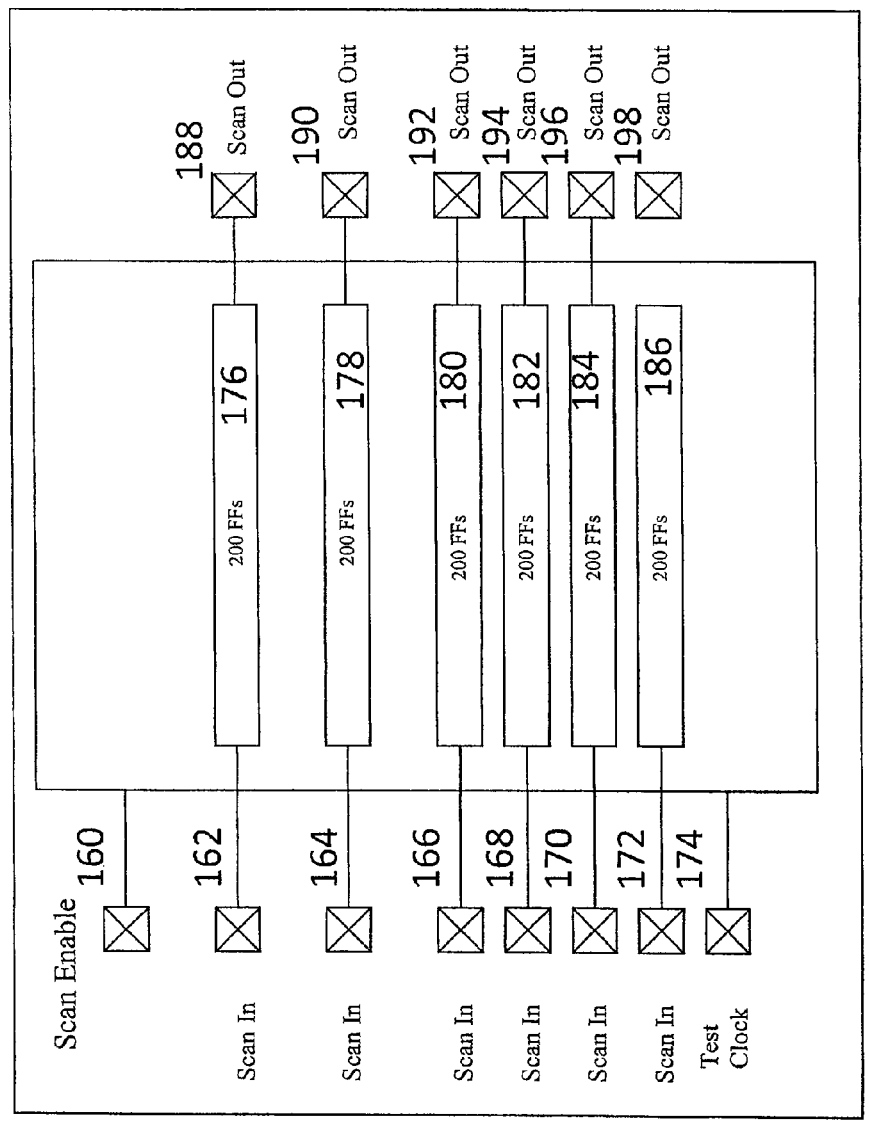
FIG. 7 shows schematically a relationship between scan chains and numbers of clocks when using the embodiment of FIG. 6.

Reference is now made to FIGS. 5 to 7. Digital circuitry may be in the form of scan chains. The clocks used during the scan test to shift the data are controllable. In a large system-on-chip, the number of shift clocks can go up to more than 50. In scan mode, this may put a serious limitation on the usage of the pad for other aspects of the test scan-in/scan-out. If the number of scan chains is reduced, this can increase the length of the scan chains in a traditional scan mode. Further, the compression ratio in a compression mode can result in more test time and pattern volume. Test compression is a technique to reduce the time and cost of testing integrated circuits. In a typical test for a fault or a set of faults, only a small percentage of scan cells need to take specific values. The rest of the scan cell values are "don't care" and can be filled with random values. Test compression takes advantage of the small number of significant values to reduce test data and test time.

Reference is made to FIG. 5 which shows a schematic diagram of scan chains versus number of clocks. As can be shown in FIG. 5, there is a scan enable input 100 and a first scan-in data input 102 for a first scan chain 104. There is also a second scan-in data input 106 for a second scan chain 108. Also shown are first to fifth test clock signals input 110, 112, 114, 116 and 118 respectively. Each scan chain comprises a number of flip-flops. By way of example only, the arrangement shown in FIG. 5 has two scan chains, each of around 600 flip flops. Each scan chain 104 and 108 is connected to a respective scan-out data output 120 and 122. In the arrangement shown in FIG. 5, most of the available input pads are used for the test clocks. As will be appreciated, different parts of the scan chain may be associated with different test clocks. For example there may be different timing domains in a given scan chain requiring different clock timings or phases. Thus there may be different segments of a scan chain clocked by different clocks.

It has been suggested to merge the test clocks having a similar frequency and functional independence. However, this may be disadvantageous in some embodiments in that it can cause problems in test action closure. This may happen because even if the domains are functionally independent, there are thousands of parts existing in the capture mode. Applying exceptions on each individual part in capture mode may be difficult in a given time frame.

Reference is made to FIG. 6 and FIG. 7 which show an arrangement where a single functional pad can be used to provide the test clock. The test clock from the pad can be de-multiplexed to provide the different clocks which are required. The selector line of the de-multiplexor is driven from flip-flops which are part of the scan chain. By reducing the number of test clocks, this may allow more pads to be made available for the scan in and scan out of data or simply allow the number of pads to be reduced.

FIG. 6 shows the clock control circuit and FIG. 7 shows the scan chain organization. It should be appreciated that the number of scan chains and number of clocks can be different. By way of example only, there can be 20 test clocks and 50 scan chains in a design.

The circuitry of FIG. 6 will now be described. The test clock input pad 130 is connected to the input of the de-multiplexor 132 as well as to first to fifth multiplexors 140, 142, 144, 146 and 148. The number of multiplexors provided in practice is equal to the number of different test clocks required.

The de-multiplexor 132 is arranged to receive an output from a first flip flop 134, a second flip flop 136 and a third flip flop 138. The number of dynamic bits required here (as represented by flip-flops 134,136,138) are "n" where $2^n$> or =to number of demultiplexor outputs. Depending on the control signal provided by the first to third flip flops 134 to 138 to the de-multiplexor, this will control to which one or more multiplexors the test clock signal is input. In some embodiments the demultiplexor may be configured to only output one clock signal at a time.

In a shift mode a Scan Enable, input 100, is high so all the test clocks are available at the input of the scan flip flops. However in a capture mode (the scan enable input is low), only one clock domain is captured in one capture cycle or the clock domains which are independent of each other are captured together. During capture mode, a data in signal may be routed to a shift register and the value is captured by a later clock state. During shift mode, the scan output of a flip flop may be passed through to the scan input of the next flip flop.

Associated with the first multiplexor is shown a first OR gate 152. The OR gate 152 is arranged to provide a control output to each of the first to fifth multiplexors 140 to 148. The OR gate 152 is arranged to receive the scan enable signal 100 and the output of a fourth flip flop 154.

When the scan enable signal is high, the scan chain is in shift mode and during this phase all the clocks are available for shifting. There are other modes such as the BIST test in which it is required that all clocks are enabled but in this test the scan enable is low. To enable all the clocks to pass through the multiplexors, the fourth flip-flop 154 can be loaded with value '1' so that all the clocks are available at the output of the multiplexors 140 to 148, even if the scan enable signal is low.

When the output of OR gate is 1, the clock from the test clock input pad 130 is available at the output of each of the multiplexers 140 to 148. In a particular test, if for example the clock from the third multiplexor 144 is not required, then the corresponding AND gate needs to be disabled using one of the register represented by 156 (156 is not a single register or a flip-flop. It is multiple register or flip-flop). The input of the multiplexer 140 to 148, which is driven by output of the de-multiplexer should be treated as the D0 input of multiplexer (and hence selected when the output of the OR gate is low) and the input driven by test clock input pad should be treated as the D1 input of the multiplexer (and hence selected when the output of the OR gate is high).

The output of the first multiplexor 140 is arranged to be input to an AND gate 158 which also receives an input from a fifth flip flop 156. Flip flop 154 and 156 are part of a special scan chain within the test controller. Only one flip-flop 156 is shown but in practice there will same number of these flip flops and AND gates as the number of multiplexors. This means the output of each multiplexor will be controlled by one flip flop bit via an AND gate. The clock can be stopped using flop 156 in case the clock is not required. The output of the AND gate then will provide a clock signal for one of the scan chains.

In some implementations, the de-multiplexor may be omitted. In one embodiment the selection function of the now omitted de-multiplexor may be provided by the AND gates 154. In other implementations, the multiplexors may be omitted. The arrangement of FIG. 6 can be replaced by other circuitry providing the same or similar functionality. In one alternative, where the de-multiplexor is removed, the number of control flip flops may be increased to provide the desired function. Some alternative embodiments may be implemented with a different gate structure to that shown.

Reference is made to FIG. 7 which shows an arrangement embodying the present invention. In this embodiment, a scan enable signal 100 is provided. Additionally, the input pads are arranged to provide respective scan-in signals 162, 164, 166, 168, 170 and 172. Each of the scan signals is input to a respective scan chain 176, 178, 180, 182, 184 and 186. Each of the scan chains is connected to a respected scan output 180, 190, 192, 194, 196 and 198. A single test clock input 174 is provided. The test clock input 174 is connected to the circuitry shown in FIG. 6. It is used to provide respective clock signals for the different scan chains. Since the number of test clock inputs required is reduced to one, the number of inputs available for scan data can be increased. This means that the length, for example of each chain can be reduced. By way of example only and as a comparison to the arrangement shown in FIG. 5, each of the scan chains is only 200 flip flops long. In FIG. 5, the scan chains were 600 flip-flops in size.

The arrangement of FIGS. 6 and 7 may provide reduced tester time. The time closure in a test mode of a STA (Static Timing Analysis) can be simplified. This means that a designer time can be saved. It should be appreciated that the tester cost is related to the number of digital channels available on the tester. With this technique, a tester with the fewer number of digital channels can be used to test the device reducing the tester cost of the SoC. As previously mentioned, the number of clock channels is the same as number of clock domains to avoid problems in STA. An issue in STA is that when a false path is declared between two clock domains the STA tool does not report false violations between the two clock domains. However, when the two clocks are merged in a single test clock, it may not be possible to define the false path between these two clocks because now there is only one clock. So during capture mode in test, many false violations are reported which can hide the real problems. STA engineers may therefore prefer to have separate test clock for each clock domain. However there are limitations from the ATE on the number of test clocks. The circuit in FIG. 6 may address one or both of these requirements.

With embodiments of the present invention, any clock inside the chip can be stopped (using the respective AND gate) which can be used for the low power testing of the memory BIST. In other words, this permits the memory BIST arrangement as described in relation to FIGS. 1 to 4 to be run, at least partially serially.

It should be appreciated that in some embodiments of the present invention, the length of the scan chains can reduced and the number of inputs required for the test clocks can be reduced. This means that the number of pads may be reduced which might lead to a reduction in chip area and cost.

Figure 8A:
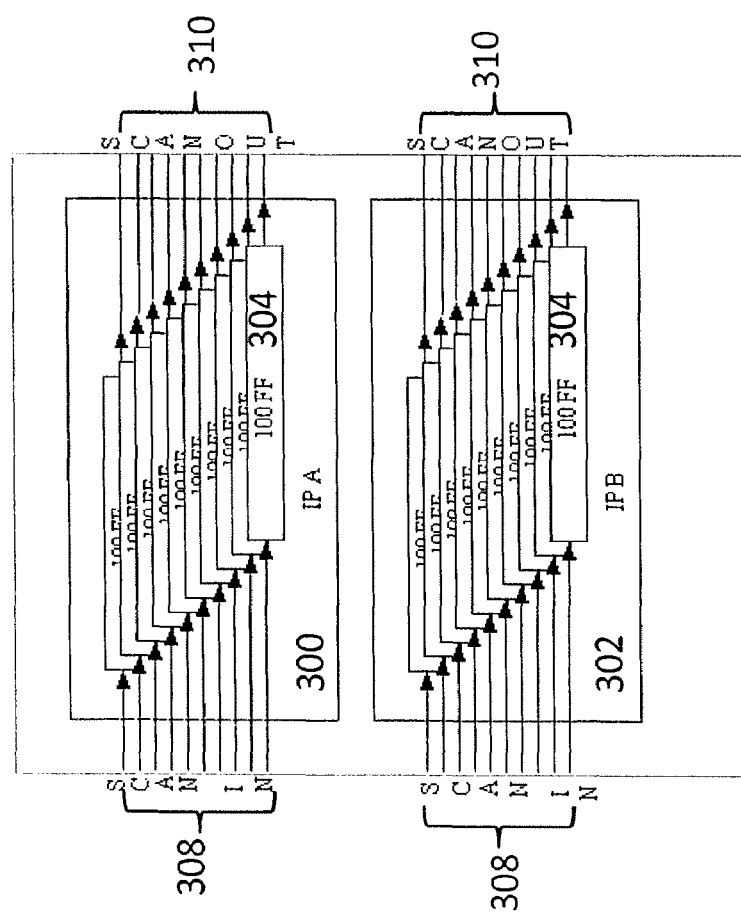
FIG. 8*a* schematically shows two blocks each having a plurality of scan chains.

Generally, the clock needed to load a single pattern is equal to the length of the scan chain. The tester memory required to hold a single pattern is two times the number of scan chains multiplied by the length of the scan chain. Reference is made to FIG. 8a which shows two banks 300 and 302. Each bank comprises a plurality of scan chains 304. Each of the scan chains 304 receives a respective scan input 308. Each scan chain provides a respective scan output 310.

Figure 8B:
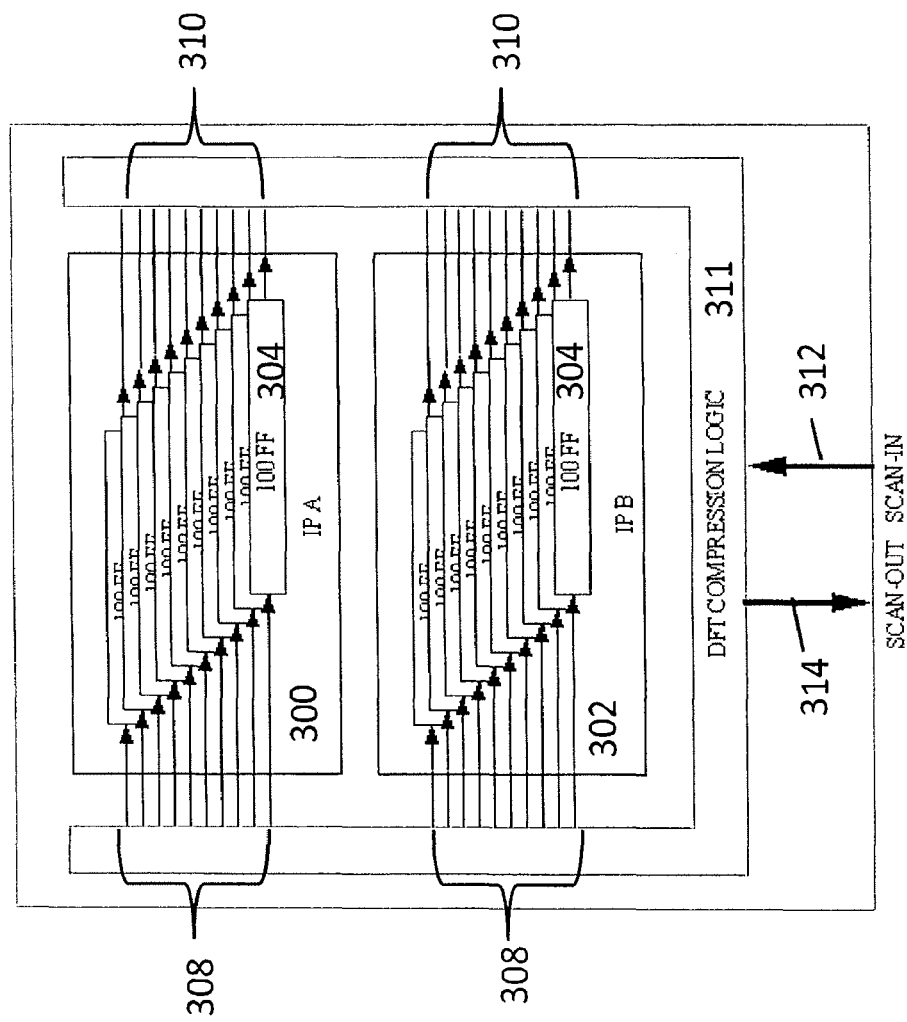
FIG. 8*b* schematically shows an arrangement similar to FIG. 8*a* but which uses design for test (DFT) compression logic.

Reference is FIG. 8b which shows scan arrangement which uses DFT (design for test) compression logic. In the arrangement of FIG. 8b, the DFT compression logic receives a scan-in input 312 and provides a scan-out output 314. The DFT compression logic is configured to provide respective scan-in inputs 308 to the respective scan chains 304 of the first and second banks 300 and 302. Furthermore the DFT compression logic 311 is configured to take the output 310 provided by the respective scan chains and manipulate those output to provide the scan output 314. With this arrangement, the width and depth can be reduced in test compression.

Reference is now made to FIG. 8c which show a similar arrangement to the arrangement of FIG. 8a. However, the second bank 302 comprises a scan chain 316 which is much longer than any of the other scan chains. All the other scan chains are equal in length. It should be appreciated that the arrangement shown in FIG. 8b can also be modified so as to include for example a scan chain 316 which is much longer than the other scan chains. Generally, the total test of time depends on the length of the scan chains and the number of patterns. The time taken to load a pattern is directly proportional to the longest chain in the system and chip. For a proper utilisation of the test memory, the scan chains should be equal in size. Accordingly, the arrangement shown in FIG. 8b would lead to a non-optimal utilisation of the tester memory, although there may be good reasons for one scan chain to be, for example, longer than the other scan chains.

It should be appreciated that the effects of compression ratio (ECR) equals (the number of uncompressed patterns multiplied by the number of shift cycles in the uncompressed mode)/(number of compressed patterns multiplied by the number of shift cycles in the compressed mode).

Figure 9:
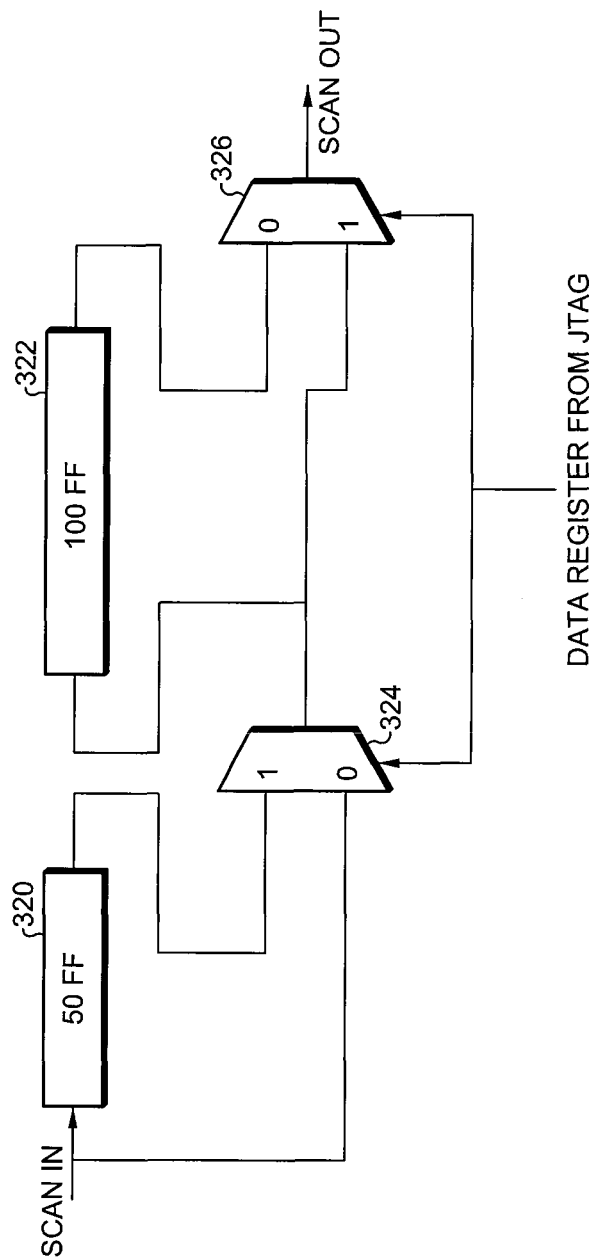
FIG. 9 schematically shows an embodiment for use with the longer scan chain of FIG. 8*c*.

Reference is made to FIG. 9 which shows an arrangement where one long scan chain can effectively be broken into two smaller scan chains. In the arrangement shown in FIGS. 8a to 8c, the banks are shown as generally having scan chains of a hundred flip flops. In the arrangement shown in FIG. 9, the one hundred and fifty flip flop scan chain of FIG. 8c is divided into a first scan chain 320 of 50 flip flops and a second scan chain of 322 of 100 flip flops. The sizes of the scan chains are by way of example only. Where one scan chain is divided into two, it is preferable that each scan chain is of a length which is less than or equal to the length of the other scan chains. It is possible in some embodiments of the invention to divide a long scan chain into three or more scan chains.

The scan-in data is input to the first flip flop 320 and to a first multiplexor 334. The output of the first scan chain 320 is also input to the first multiplexor 334. The output of the first multiplexor 334 is input to the second scan chain 322 or to a second multiplexor 326. The output of the second chain 322 is output to the second multiplexor 326. The output of the second multiplexor 326 provides the scan-out signal. The first and second multiplexors 324 and 326 are controlled from a JTAG data register.

If the scan-in data is intended for the first scan chain, then the scan-in data is input to the first scan chain 320 and the first multiplexor 324 is arranged to provide as its output the output of the first scan chain 320. The second multiplexor is controlled to provide the output of the first multiplexor and hence the output of the first scan chain as the scan output.

However, when the scan data is intended for the second scan chain, the first multiplexor 324 is configured to output the scanned-in data to the second scan chain and the second multiplexor is configured to output the output of the second scan chain 322 as the scan output. In this way, longer scan chains can be accommodated as the tester regards the scan chains as being two shorter scan chains.

In some embodiments of the present invention it is possible to feed the output of the first scan chain into the input of the second.

Embodiments of the invention may be used for late changes of design. If the change has violated a rule of a maximum number of flip-flops in a change, the arrangement shown in FIG. 9 can be used. This avoids the need to re-spin the design which can be time consuming and/or expensive. It should be appreciated that there may be advantages to using the arrangement earlier in a design process, in other embodiments.

It should be appreciated that three aspects have been in relation to the above accompanying figures. It should be appreciated that any two or more of the above described aspects can be provided a single embodiment.

It should be appreciated that some embodiments of the present invention have been described in relation to BIST memory. It should be appreciated that embodiments of the present invention can be used with any BIST arrangement.

While some embodiments have used BIST circuitry in the form of scan chains, it should be appreciated that alternative embodiments of the invention may be configured to use other forms of test circuitry.

The described arrangements show multiplexers and de-multiplexors. It should be appreciated that in alternative embodiments of the invention, these can be replaced by any other suitable selection circuitry.

In the described arrangements show examples of logic gates such as AND or OR gates. It should be appreciated that these gates may be replaced by other circuitry or other types of logic gates.

While the above detailed description has set forth some embodiments of the present invention, the appended claims cover other embodiments of the present invention which differ from the described embodiments according to various modifications and improvements. Other applications and configurations may be apparent to the person skilled in the art.

The invention claimed is:

1. An integrated circuit (IC) comprising:
   at least one first group comprising a plurality of first portions to be tested, each of said plurality of first portions having respective first test circuits; and
   at least one second group comprising at least one second portion to be tested, the at least one second portion having at least one respective second test circuit;
   said at least one first and second groups being configured so that in use said first test circuits are configured to run in parallel with said at least one second test circuit, and said first test circuits are configured to run serially;
   wherein each of said first test circuits and at least one second test circuit comprises an output node configured to output a first output signal as a test completed output signal and otherwise a second output signal; and
   wherein said output node is coupled to an associated input node of a subsequent test circuit.

2. The IC of claim 1, wherein each of said first portions and said at least one second portion comprises a memory portion.

3. The IC of claim 1, wherein each of said first and second test circuits comprises a built in self test circuit.

4. The IC of claim 1, wherein when said output node of a given test circuit provides said first output signal, said given test circuit is configured to stop running a test.

5. The IC of claim 1, wherein said first output signal comprises a high output.

6. An integrated circuit (IC) comprising:
   a plurality of first portions having respective first test circuits; and
   a plurality of second portions having respective second test circuits;
   said first test circuits configured to run in parallel with said second test circuits, and said first test circuits configured to run serially;
   wherein each of said first test circuits and at least one second test circuit comprises an output node configured to output a first output signal as a test completed output signal and otherwise a second output signal; and
   wherein said output node is coupled to an associated input node of a subsequent test circuit.

7. The IC of claim 6, wherein each of said first and second portions comprises a memory portion.

8. The IC of claim 6, wherein each of said first and second test circuits comprises a built in self test circuit.

9. The IC of claim 6, wherein when said output node of a given test circuit provides said first output signal, said given test circuit is configured to stop running a test.

10. The IC of claim 6, wherein said first output signal comprises a high output.

11. A System on Chip (SoC) comprising:
    a plurality of first SoC portions having respective first test circuits; and
    a plurality of second SoC portions having respective second test circuits;
    said first test circuits configured to run in parallel with said second test circuits, and said first test circuits configured to run serially;
    wherein each of said first test circuits and at least one second test circuit comprises an output node configured to output a first output signal as a test completed output signal and otherwise a second output signal; and
    wherein said output node is coupled to an associated input node of a subsequent test circuit.

12. The SoC of claim 11, wherein each of said first and second SoC portions comprises a memory portion.

13. The SoC of claim 11, wherein each of said first and second test circuits comprises a built in self test circuit.

14. The SoC of claim 11, wherein when said output node of a given test circuit provides said first output signal, said given test circuit is configured to stop running a test.

* * * * *